United States Patent [19]

Cirri

[11] 4,169,976
[45] Oct. 2, 1979

[54] PROCESS FOR CUTTING OR SHAPING OF A SUBSTRATE BY LASER

[75] Inventor: Gian Franco Cirri, Florence, Italy

[73] Assignee: Valfivre S.p.A., Florence, Italy

[21] Appl. No.: 861,707

[22] Filed: Dec. 19, 1977

Related U.S. Application Data

[63] Continuation-in-part of Ser. No. 772,470, Feb. 28, 1977, abandoned.

[30] Foreign Application Priority Data

Feb. 27, 1976 [IT] Italy .............................. 20681 A/76

[51] Int. Cl.² ............................................. B23K 9/00
[52] U.S. Cl. ........................................... 219/121 LM
[58] Field of Search ..... 219/121 L, 121 LM, 121 EB, 219/121 EM; 30/92

[56] References Cited

U.S. PATENT DOCUMENTS

| | | | |
|---|---|---|---|
| 2,989,614 | 6/1961 | Steigerwald | 219/121 EM |
| 3,588,440 | 6/1971 | Morse | 219/121 LM |
| 3,612,814 | 10/1971 | Houldcroft | 219/121 L |

*Primary Examiner*—J. V. Truhe
*Assistant Examiner*—Fred E. Bell
*Attorney, Agent, or Firm*—Ostrolenk, Faber, Gerb & Soffen

[57] ABSTRACT

A process for cutting or shaping of a ceramic substrate with laser light, comprising pulsing the laser light and moving the pulsing laser light source with respect to the substrate so that individual light pulses strike different spots along the substrate, defining a path; the laser light may pierce the substrate.

11 Claims, 7 Drawing Figures

PROCESS FOR CUTTING OR SHAPING OF A SUBSTRATE BY LASER

CROSS REFERENCE TO RELATED APPLICATION

This is a continuation-in-part of application Ser. No. 772,470, filed Feb. 28, 1977, now abandoned.

BACKGROUND OF THE INVENTION

This invention relates to a process for providing openings in, or for shaping substrates, and particularly ceramic substrates, by use of a laser beam.

At present, openings in, or shaping of ceramic substrates are normally provided in the initial molding of the ceramic material. However, such a process is economical only when a very large number of substrates are to be shaped.

SUMMARY OF THE INVENTION

It is the object of the present invention to provide a process for drilling, or shaping of ceramic substrates, which is economical, even when the process is practiced on a small number of ceramic substrates.

It is another object of the invention to perform the foregoing process using a laser beam.

The process according to the invention, comprises directing a pulsed beam of laser light on the substrate portion to be drilled, or shaped and relatively moving the laser source and the substrate with respect to each other while the laser source is emitting its pulsed beam. This produces a series of small holes on the substrate at each pulse of the light beam and these follow a path across the substrate. When the pulses strike the substrate at locations quite near to each other so that the impact points of the pulses partially overlap, and when the pulses are of a strength to pierce the substrate, they form a continuous cut through the substrate.

The use of a pulsed laser beam, as contrasted with a continuous laser beam, has the purpose of reducing the development of thermal gradients within the substrate material. Such thermal gradients would be of quite high value and they could cause fracturing in the substrate, especially if the substrate is relatively thick. During each laser pulse, because of the very high power of the laser light, sublimation gases are formed and they expand very rapidly. This causes a small explosion at each point of impact of the laser light beam on the substrate. Because of this, it is undesirable to superimpose a plurality of laser light pulses at the same location on the substrate, especially for piercing through the material from one side to the other side. The repeated explosions would cause microscopic fractures that would leave the substrate vulnerable to subsequent mechanical stresses. Further, mechanical stresses within the material itself would occur at the time of each explosion. These weaknesses would prevent the substrate from even passing standard inspection tests, such as repeated immersion of the substrate in liquid nitrogen and in molten tin without breaking.

On the other hand, applying only a single laser light pulse to a particular spot on the surface of the substrate reduces the damage to the substrate. To pierce the substrate by only a single laser light pulse, the power of each laser pulse is selected to be related to the material of which the substrate is comprised and to the thickness of the substrate so that a single pulse makes the through hole.

The damage to the substrate is greatest at the initial hole through the substrate. Also, the first hole tends to have a ragged or burred edge. To produce a neater cut line, where possible, the beam of laser light starts to drill through the substrate at a zone which is intended to be removed or cut away by the pulsed laser beam. The initially drilled hole becomes a line of partially overlapping holes and produces an elongated cut through path. During the initial pulses of the laser beam, there are still residual stresses or tension in the substrate material. These disappear, however, when there is an enlarged elongated perforation pathway through which the gas that is generated by the explosion caused by each laser pulse may escape. Thus, later pulses after the initial pulse do not cause as great damage to the substrate and do not leave it as vulnerable.

The invention provides a novel process for piercing a substrate without destroying or altering the chemical or physical characteristics of the substrate. As a result, after the substrate has been pierced, its use is not later compromised or restricted.

The process of the invention is preferably performed using a carbon dioxide ($CO_2$) laser. One particular substrate with which the invention may be practiced is preferably comprised of a ceramic and one particular ceramic is an alumina substrate such as that used in the electronic industry for producing hybrid thick or thin film circuits.

BRIEF DESCRIPTION OF THE DRAWINGS

The invention will now be described by way of embodiments thereof.

In the accompanying drawings.

DESCRIPTION OF THE PREFERRED EMBODIMENTS

Figure 1:
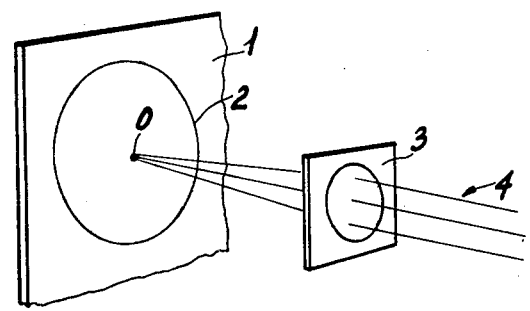
FIG. 1 schematically shows a beam of laser light incident on a ceramic substrate to be drilled.

In FIG. 1, there is a ceramic substrate 1 that is comprised, for example, of 94-99% $Al_2O_3$, alumina. The substrate is used to form thin or thick films, in which a circular opening 2 is to be provided. It is obvious that the process of the invention is also applicable to other types of ceramic materials, for example piezoelectric ceramic.

Figure 7:
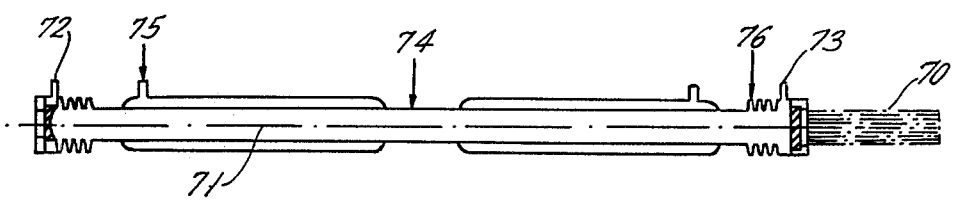
FIG. 7 schematically illustrates a laser beam source used for performing the process of the invention.

A focusing lens 3 is spaced from the substrate 1 to concentrate a beam of laser light 4 from a laser, of the type shown in FIG. 7, for instance, on the substrate 1 to define the opening 2. This beam of light 4 is of a pulsed type, and pulse repetition and timing are electronically controlled. Additionally, each pulse is of sufficient intensity and duration for a particular substrate material and substrate thickness as to produce a small hole 0 in the substrate.

In order to remove all the material within and thereby to define the opening 2, the beam of laser light 4 is first concentrated in the central zone of opening 2 at the small hole 0. This whole section inside opening 2 is being drilled out. Drilling of the opening conveniently starts from the central zone of the opening 2 in order to avoid weakening of the substrate by the above described fracturing effect of the explosion at the first small hole 0 and to eliminate the presence of burrs that develop around the periphery of the first hole to be drilled through the substrate by the pulsed laser beam. The damaged zone of the substrate is part of the section thereof which will be removed.

Following the drilling of the initial hole 0, the laser beam is gradually moved outwardly along the path shown by arrow $F_1$. Next, the beam is moved along the circumference of opening 2, along the path shown by arrow $F_2$. Moving the beam is accomplished by appropriate relative motion of the substrate 1 and the laser source. One or both of these can be moved. In the preferred embodiment, means are provided for causing forward movement of the laser beam, in this case with the aid of known electronic controls and programmers.

The forward movement of the laser beam along the paths $F_1$, $F_2$ is synchronized with the laser beam pulse repetition rate or frequency, so that the individual small holes drilled by each laser light pulse, starting from the central small hole 0 and moving out to A and then over a 360° path from A, partially overlap to provide a slit having the configuration of an annular crown 5. The external circumference of this crown corresponds to the opening 2.

Figure 2:
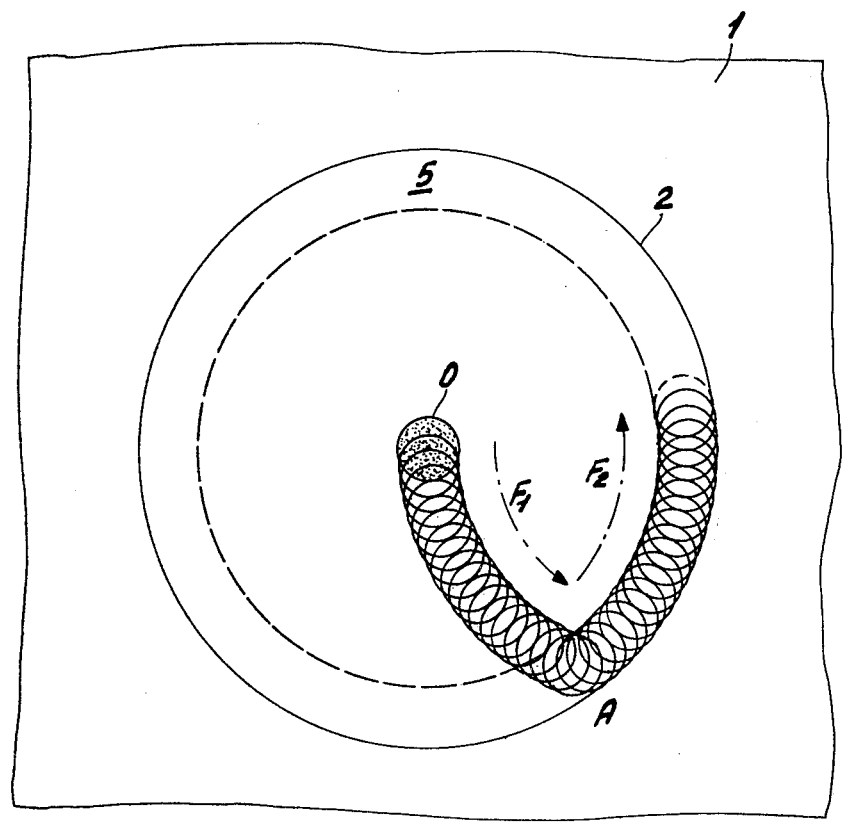
FIG. 2 schematically shows a series of laser pulses used for drilling the substrate of FIG. 1 according to the process of the invention.

In FIG. 2, the individual holes formed by each pulse of the laser beam in part overlap. This is a function of the duration of the interval between successive pulses, i.e. the frequency of the pulses, and the speed of the relative movement of the laser beam and the substrate. The overlapping holes produce a continuous line pathway in the substrate, facilitating removal of the cut out section of the substrate. A different pulsing rate or relative beam and substrate motion speed will produce a discontinuous series of holes.

A circular opening 2 was just described. But, of course, holes can be drilled along a path to generate any geometrical shape or line form or to trim off part of the substrate, all according to the process of the invention.

Figure 3:
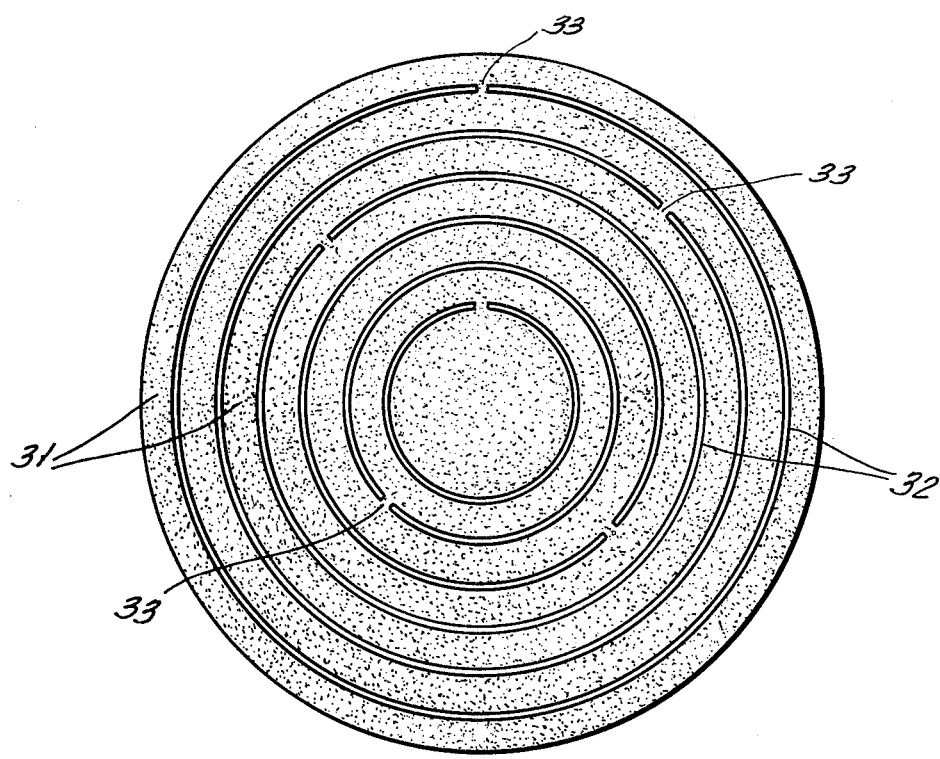
FIG. 3 illustrates a concentric array of elements that have been formed by a process according to the invention.
Figure 4:
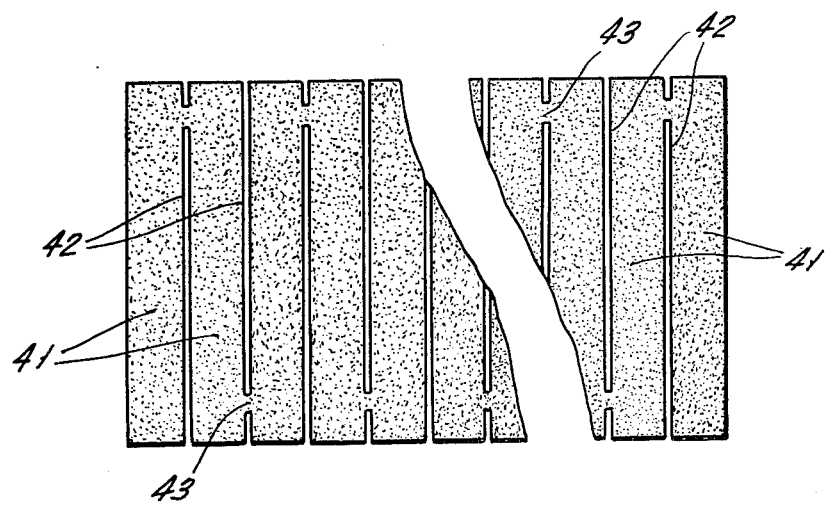
FIG. 4 illustrates a linear array of elements that have been formed by a process according to the invention.

FIGS. 3 and 4 show other configuration for the cuts through the substrate that are made by the advancing pulsed laser beam. With reference to FIGS. 3 and 4, substrates comprised of materials capable of transducing mechanical to electrical energy are shown. For example, the substrates can be comprised of a monolithic piezoelectric material or they may be a ferromagnetic or magnetostrictive material, such as a ferrite. Transducers of such materials are often used, for example, in systems for clinical ultra-sound apparatus and for nondestructive ultra-sound tests of inert materials. The pulsed laser beam can be used for forming a plurality of transducers from a substrate, with the advantage of assuring alignment of the several transducing elements while maintaining independent operation thereof.

FIGS. 3 and 4 respectively show a concentric array and a parallel linear array of transducers. In FIGS. 3 and 4, the transducing elements 31 and 41 respectively have been separated by laser beam formed openings 32 and 42. The individual elements 31 and 41 are connected together by short width bridging elements 33 and 43 which are formed simply by periodically discontinuing the laser pulse for a short interval as the laser beam and substrate move relative to one another.

Figure 5:
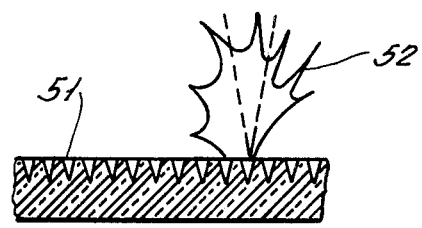
FIG. 5 is a schematic cross-sectional view through a substrate that has been scribed with such pulses as to not completely pierce the ceramic substrate.

FIG. 5 shows that the material of the substrate and/or the thickness of the substrate and/or the strength of the laser beam may be selected such that the substrate is scored, scribed or pock marked by the pulsed laser beam instead of being cut completely through. The individual score marks or pock marks 51, which are generally conical in cross-section, are produced in one surface of the substrate by the individual small size explosions 52 which are caused by the pulsed laser beam.

Figure 6:
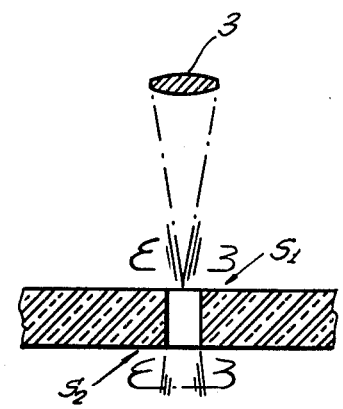
FIG. 6 is a schematic cross-sectional view through a substrate that has been pierced by a process according to the invention.

In FIG. 6, the material of the substrate, and/or the thickness of the substrate and/or the strength of the laser beam are selected so that a single pulse of the laser beam completely pierces through the substrate between the free surfaces $S_1$ and $S_2$. The explosion of material caused by the laser beam is dissipated above both of the opposite free surfaces $S_1$ and $S_2$ instead of dissipating only over the signal surface in FIG. 5. In the laser pulsing process depicted in FIG. 6, therefore, stresses in the ceramic substrate are halved or at least substantially reduced as compared with the score marks of FIG. 5.

With reference to FIG. 7, a preferred laser device for producing a laser beam for performing the process of the invention is a carbon dioxide type of laser, well known in the art. General features of such a laser device are disclosed in *Laser Handbook* (North-Holland Publishing Co., Amsterdam 1972), Vol. 1, pp. 599–629. This laser is particularly suited for forming cuts, scoring or shaping in ceramic substrates and particularly alumina substrates. The carbon dioxide laser device shown in FIG. 7 emits a radiation beam 70 having a wave length of 10.6 $\mu$m. The radiation beam is completely absorbed by the ceramic material of the substrate. The discharge tube 71 of the laser is approximately 2 meters long. The gas mixture used is comprised of carbon dioxide helium and nitrogen and the gas mixture circulates within the tube through aperture 72 and 73. An electric discharge in the tube is established between the anode 74 and the two cathodes 75 and 76 which are connected to two electronic circuits (not shown). The electric discharge is at 16KV potential. The discharge current can be maintained at a constant value. In that case, the emitted radiation is continuous, with a power adjustable between 0 and beyond 100 watts. Upon pulse modulation of the current, the emitted radiation from the laser is also pulsed. The peak power of each pulse is, in this case, substantially higher than the continuous value of the emitted radiation. The pulses produced by the laser are of sufficient strength for piercing through the substrate and/or for scoring the substrate as a particular embodiment requires.

Although the present invention has been described in connection with a plurality of preferred embodiments thereof, many variations and modifications will now become apparent to those skilled in the art. It is preferred, therefore, that the present invention be limited not by the specific disclosure herein, but only by the appended claims.

What is claimed is:

1. A process for providing openings in, scoring of or shaping of a substrate of a ceramic material, or the like, by laser, comprising the steps of:

supplying a pulsed beam of laser light on the substrate portion to be drilled, scored or shaped, thereby producing a small size hole where each pulsed beam of light strikes the substrate; and in synchronized relationship with the light beam pulses, relatively moving the laser beam and the substrate with respect to each other so that the light beam pulses follow a path corresponding to the shape of the opening that has been drilled, the scoring path that has been scored or the shaping to be made in the substrate.

2. A process as claimed in claim 1, wherein the beam of laser light and the substrate are relatively moved and the frequency of the pulses of the beam of laser light are selected so that any spot on the substrate along the path is struck by only one light beam pulse.

3. A process as claimed in claim 1, wherein the duration of the intervals between successive pulses of the beam of laser light and the speed of the relative motion of the laser beam and the substrate are related such that each pulse of the beam of laser light strikes the substrate at a striking spot so near to the striking spot of the next pulse, that adjacent holes in the substrate partially overlap forming a continuous pathway.

4. A process as claimed in claim 3, wherein the path of the light beam pulses defines a section of the substrate that is intended to be removed by the remainder of the substrate after the pulsed light beam has moved over the path and the path of the beam of laser light first starts in the section of the substrate intended to be removed and thereafter moves along a pathway which cuts off the section to be removed.

5. A process as claimed in claim 1, wherein the path of the light beam pulses defines a section of the substrate that is intended to be removed by the remainder of the substrate after the pulsed light beam has moved over the path and the path of the beam of laser light first starts in the section of the substrate intended to be removed and thereafter moves along a pathway which cuts off the section to be removed.

6. A process as claimed in claim 1, wherein the material of the substrate, the thickness of the substrate and the intensity of each pulsed beam of laser light are selected so that the substrate is pierced through by each pulse of the beam of laser light.

7. A process as claimed in claim 6, wherein the beam of laser light and the substrate are relatively moved and the frequency of the pulses of the beam of laser light are selected so that any spot on the substrate along the path is struck by only one light beam pulse.

8. A process as claimed in claim 1, wherein the duration of the intervals between successive pulses of the beam of laser light and the speed of the relative motion of the laser beam and the substrate are related such that each pulse of the beam of laser light strikes the substrate quite near to the striking spot of the next pulse, so that adjacent holes in the substrate partially overlap.

9. A process as claimed in claim 1, wherein the substrate is comprised of alumina.

10. A process as claimed in claim 1, wherein the laser light is supplied by a carbon dioxide laser.

11. A process as claimed in claim 10, wherein the substrate is comprised of alumina.

* * * * *